(12) United States Patent
Satoh

(10) Patent No.: US 6,858,263 B2
(45) Date of Patent: Feb. 22, 2005

(54) METHOD OF MANUFACTURING APERTURE PLATE

(75) Inventor: Hiroshi Satoh, Machida (JP)

(73) Assignee: Daiwa Techno Systems Co., Ltd., Tokyo (JP)

( * ) Notice: Subject to any disclaimer, the term of this patent is extended or adjusted under 35 U.S.C. 154(b) by 442 days.

(21) Appl. No.: 10/067,542

(22) Filed: Feb. 7, 2002

(65) Prior Publication Data
US 2003/0148040 A1 Aug. 7, 2003

(51) Int. Cl.[7] .................................................. H05H 1/24
(52) U.S. Cl. ........................................ 427/569; 427/576
(58) Field of Search ................................ 427/569, 576

(56) References Cited

U.S. PATENT DOCUMENTS 3,785,783 A * 1/1974 Mynard et al. ............. 428/557
5,372,849 A * 12/1994 McCormick et al. ........ 427/253
5,403,620 A * 4/1995 Kaesz et al. ................. 427/252

* cited by examiner

Primary Examiner—Bret Chen
(74) Attorney, Agent, or Firm—Manabu Kanesaka

(57) ABSTRACT

A method of manufacturing an aperture plate using a plasma excitation chemical vapor deposition (CVD) device includes the steps of placing a metal plate in a vacuum chamber of the CVD device; discharging air inside the vacuum chamber; charging a mixture of a gas containing at least osmium and a gas containing a hydrogen gas; adjusting a pressure of the vacuum chamber at a predetermined level; and generating plasma inside the vacuum chamber. An electrically conductive amorphous coating having a dense structure is uniformly formed over a surface and an interior of a micro-hole of the aperture plate. Also, it is possible to form an osmium coating having a high purity and a low impurity content with good repeatability.

8 Claims, 3 Drawing Sheets

Fig. 4(a)

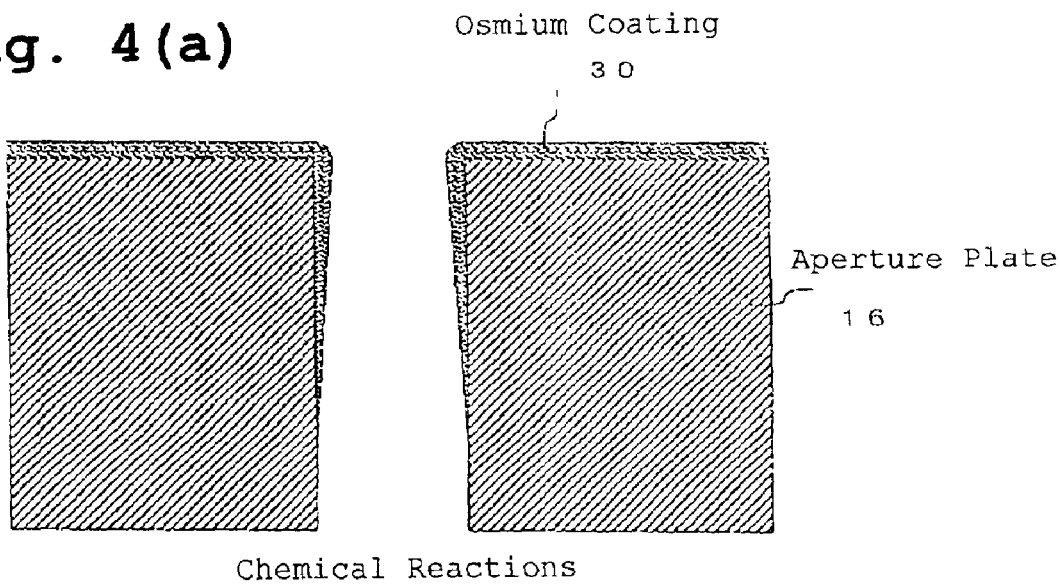

Chemical Reactions $$OsO_4 + Ar^+ \rightarrow OsO_3 + O + Ar^+$$
$$OsO_3 + Ar^+ \rightarrow OsO_2 + O + Ar^+$$
$$OsO_2 + Ar^+ \rightarrow OsO + O + Ar^+$$
$$OsO + Ar^+ \rightarrow Os + O + Ar^+$$
$$Os + nO \rightarrow OsO_n \quad (n=1 \sim 4)$$

Argon Only

Fig. 4(b)

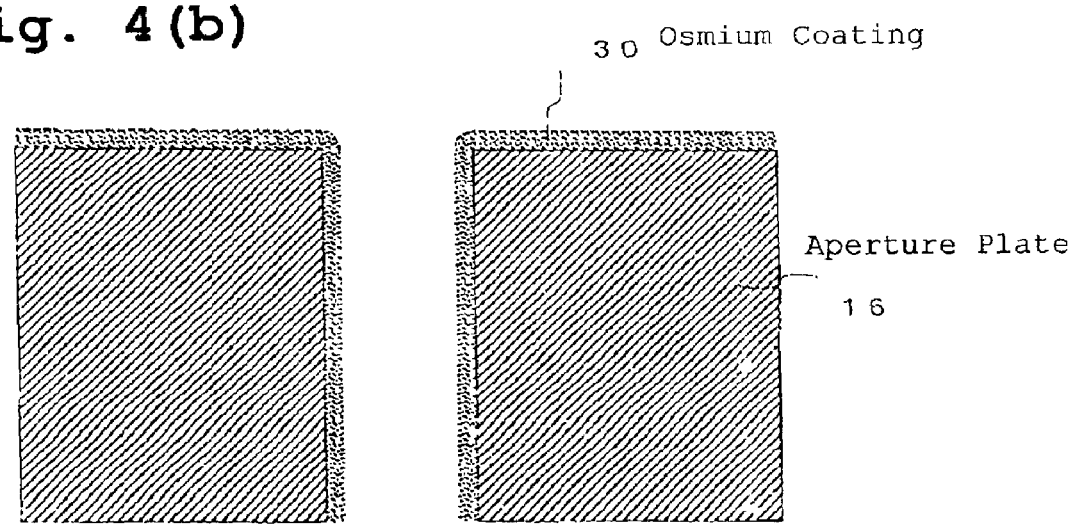

Chemical Reactions $$OsO_4 + 2H \rightarrow OsO_3 + H_2O$$
$$OsO_3 + 2H \rightarrow OsO_2 + H_2O$$
$$OsO_2 + 2H \rightarrow OsO + H_2O$$
$$OsO + 2H \rightarrow Os + H_2O$$

Add Hydrogen

METHOD OF MANUFACTURING APERTURE PLATE

BACKGROUND OF THE INVENTION AND RELATED ART STATEMENT

The invention relates to a method of manufacturing an aperture plate or diaphragm, more particularly, a method suitable for manufacturing an aperture plate with a high precision to be used for an electron beam apparatus, such as an electron microscope.

Heretofore, in an electron beam device, such as an electron microscope, an aperture plate for controlling a diameter of an electron beam has been used. The aperture plate is formed such that a micro-hole is provided on a plate made of high melting point metal, such as molybdenum, wherein a coating of platinum or platinum palladium is applied on the surface of the aperture plate to prevent electrical charge and contamination, for example, as disclosed in Japanese Patent Publication (TOKUKAIHEI) No. 04-206244.

As described above, in the conventional aperture plate, an etching has been used as a method for making the micro-hole on the aperture plate. A resist for the etching of the molybdenum plate must stand high heat, corrosion and acid. Thus, the resist is different from a resist used for production of the normal semiconductor. However, there have been problems such that if the resist is not completely removed to thereby remain on the surface of the aperture plate, the resist residue, which is an insulating material, is electrically charged on its surface. When the aperture plate is mounted on an electron microscope, the charged aperture plate causes a negative effect on the electron beam, and also the resist residue becomes a contamination, i.e. impurity source, which lowers the microscope resolution.

Also, there has been a thermal damage problem. Even if platinum is coated on the aperture plate, the resist residue is easy to vaporize by the heat created by the electron beam, and the coating peels off. As the resist is an insulating material, if the resist residue vaporizes and condenses on the surface, the surface holds electron charge, and interferes the electron beam.

To solve the problems, the aperture plate is cleaned by a novel cleaning method and is further coated by osmium. These techniques are disclosed in Japanese Patent Publications No. 11-030364 and No. 11-208534. In the techniques of the publications, it has been confirmed that application of an osmium coating to the aperture plate is extremely effective for eliminating the electron charge and contamination of the aperture plate due to high second ionization energy of osmium.

Plasma spattering and plasma excitation chemical vapor deposition (CVD) are used as a method for coating osmium on the aperture plate. For example, in plasma spattering, rare gas plasma is generated; charged particles from the rare gas collide against osmium; and osmium atoms are accumulated on the aperture plate.

However, according to the plasma spattering method, it is difficult to form a uniform osmium layer inside a micro-hole since the osmium atoms are accumulated according to its physical mechanism. Since a coating layer structure is determined by a topological angle of an opening portion of the micro-hole, it is difficult to form a uniform layer to cover an interior of the micro-hole.

On the other hand, according to the plasma excitation CVD, a precursor is transferred by a gas containing osmium and reacted on a surface of a plate. Thus, the precursor can reach the interior of the micro-hole, so osmium can accumulate the interior of the micro-hole.

In the plasma excitation CVD, an osmium oxide sublimation gas is used from the standpoints of a vapor pressure and an impurity contained therein. However, since the sublimation gas contains oxygen, oxygen contaminates the coated layer as an impurity.

Using the techniques in the prior publications, an electrically conductive amorphous osmium having extremely small oxygen content can be obtained by controlling a structure, base plate temperature, gas pressure and power of the plasma generating device. Also, a dense osmium coating with extremely low oxygen content can be obtained by annealing.

However, since a chemical bonding between oxygen and osmium is strong, a trace amount of oxygen still remains in the coating. Therefore, the anti-static character of the coating is deteriorated, and it is still very difficult to achieve consistent characteristics of the respective apertures, which greatly affects the repeatability of the product.

An object of the present invention is to solve the problems in the conventional techniques as described above and to provide a method of manufacturing an aperture plate, wherein a good repeatability can be obtained.

Another object of the invention is to provide a method of manufacturing an aperture plate, wherein an electrically conductive amorphous coating having a high density and purity can be formed to an interior of a micro-hole, and an aperture plate with such high quality coating can be produced.

Further objects and advantages of the invention will be apparent from the following description of the invention.

SUMMARY OF THE INVENTION

The present invention provides a method of manufacturing an aperture plate or diaphragm that is used for an electron beam apparatus. More specifically, the method includes a step of adding a hydrogen gas to a sublimation gas consisting of an osmium oxide in the plasma excitation chemical vapor deposition (CVD) when an osmium coating is applied to a metal plate with a micro-hole.

According to the present invention, it is possible to uniformly form an electrically conductive amorphous coating with a dense structure on a surface of an aperture plate, even an interior of the micro-hole, with good repeatability. Further, it is possible to form an osmium coating having a low impurity (such as oxygen) concentration and high purity.

BRIEF DESCRIPTION OF THE DRAWINGS

FIGS. 4(a) and 4(b) are drawings showing sectional views of an apertures plate and suggested chemical reactions according to the embodiment of the present invention.

DETAILED DESCRIPTION OF PREFERRED EMBODIMENT

Figure 1:
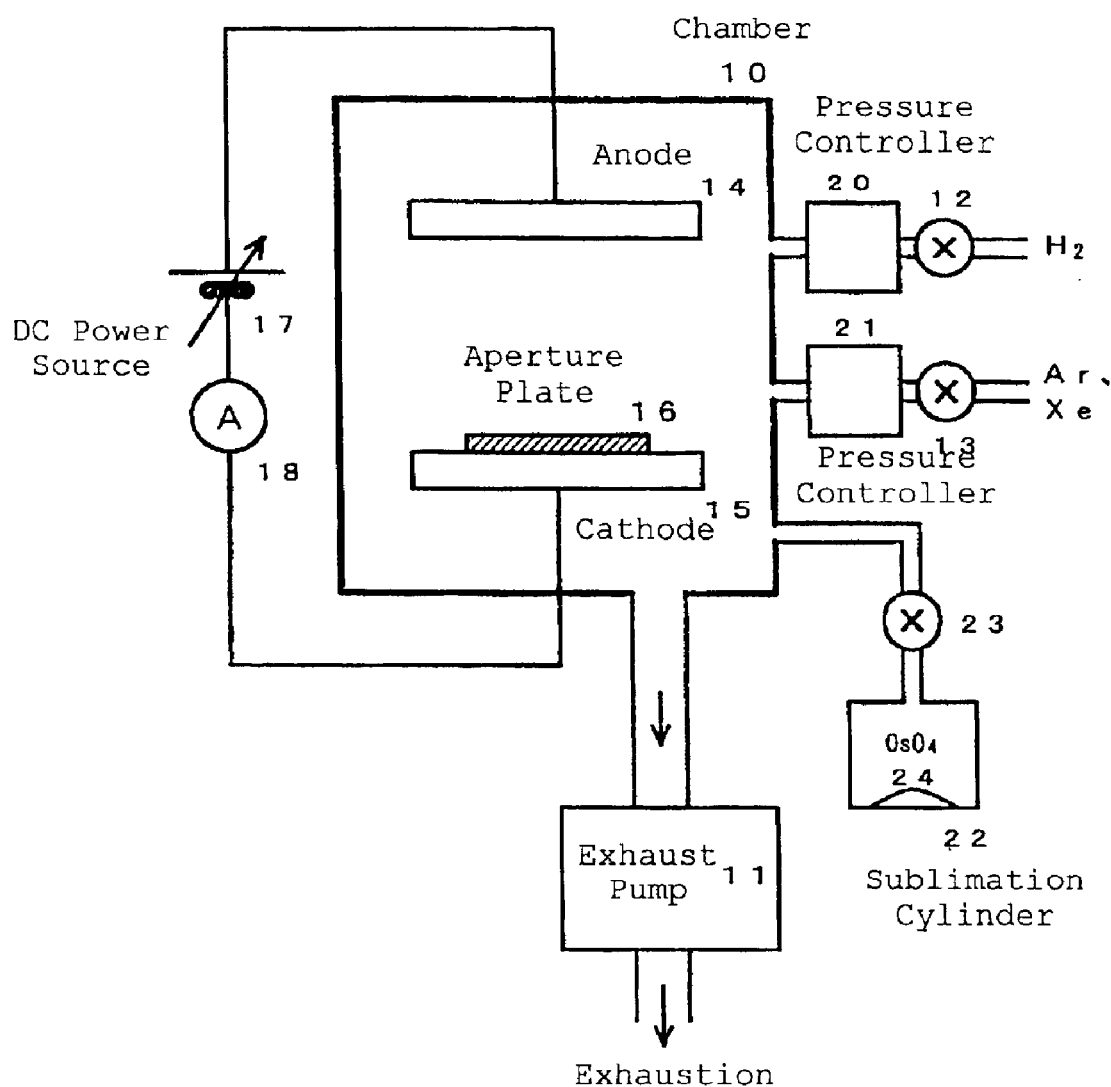
FIG. 1 is a block diagram of a coating process according to the present invention.

Hereunder, an embodiment of the present invention will be explained in detail. A manufacturing process of an aperture plate for an electron microscope comprises the following three steps. A first step includes making a hole with a predetermined size on a molybdenum plate by etching. The molybdenum plate is applied with a baking treatment in a vacuum furnace and finished by a rolling roll to have a predetermined thickness and surface roughness. Then, the molybdenum plate is applied with a thermal treatment in a hydrogen furnace in a state where the plate is leaned against a wall. Thereafter, a hole with a predetermined diameter is made by etching.

A photo resist used in the etching process is a mixture of, for example, xylene, ethylbenzene, cyclo-polyisoprene. The photo resist is different from those for manufacturing semiconductors, as it is required to withstand high temperature over 1,000° C., corrosion and acids, such as a sulfuric acid or a hydrofluoric acid. Therefore, although the resist is removed from the aperture plate to a certain extent by reactive iron etching (RIE) device after the hole is made, the molybdenum plate is not sufficient to be used as the aperture plate since the resist residue still remains on a surface of the aperture plate after the resist removing process.

Next, as a second step, cleaning the plate is carried out in order to remove the resist. In the second cleaning step, first, ten aperture plates with a hole are placed in a beaker filled with 50 cc of sulfuric acid, an analytical grade with a concentration of 97%, and heated to 80 to 120° C. Then, the ten pieces of aperture plates are placed in a heated sulfuric acid for 10 to 20 minutes.

Thereafter, the sulfuric acid is discharged, and 50 cc of an EL mixture heated at 30 to 70° C. is poured into the beaker. The EL mixture is a mixture of sulfuric acid, an electronic industry grade with a concentration of 96%, and hydrogen peroxide, an electronic industry grade with a concentration of 30%, at a ratio of 4:1~6:1. The beaker is set in an ultrasonic cleaning device for about 40 seconds to 1 minute to clean the aperture plates. The EL mixture is discharged from the beaker after the ultrasonic cleaning.

Next, the distilled water heated at 40~50° C. is poured into the beaker containing the aperture plates to wash two times. Further, the aperture plates are transferred into a net basket and are put into the beaker together with the net basket. 150 cc of distilled water heated at 40~50° C. is added to the beaker, and the beaker is set in an ultrasonic cleaning device to carry out the ultrasonic cleaning for one to two minutes. The ultrasonic cleaning is repeated several times. Finally, the aperture plates are taken out one by one to be inserted into a micro-tube, respectively, and are dried by heating at several hundred degrees Celsius.

It was confirmed by an electron microscope that the resist residue after the etching step was almost completely removed through the above cleaning step.

Next, as a third step, a coating step will be explained. FIG. 1 is a diagram showing the coating step by the plasma excitation CVD according to the present invention. As one example, a molybdenum aperture plate 16 having a micro-hole is placed on a cathode plate 15 in a plasma reactor, i.e. vacuum chamber, 10 provided with the cathode plate 15 and an anode plate 14.

Osmium is used as metal for coating the aperture surface. When platinum or platinum palladium is coated on an aperture plate, metal is crystallized, i.e. granulated, to create a rough coating surface. However, when osmium is used according to the present invention, the coating is a uniform and hard amorphous thin film, and its electrical conductivity is higher than that of conventional metal. Also, since osmium has a high melting point of 2,700° C., the osmium coating is not damaged by an electron beam radiation of an electron microscope. Therefore, a sufficiently focused strong beam can be irradiated with a high acceleration voltage to thereby bring resolution of the electron microscope into its full limit.

In the coating step, a vacuum of $10^{-4}$~$10^{-5}$ torr is obtained by an oil diffusion pump as an exhaust pump. Also, it is possible to further lower oxygen and water vapor by injecting an inert gas, such as an argon gas, a helium gas or a nitrogen gas, through a valve 13 after exhaustion. Incidentally, the injection and exhaustion of the inert gas may be repeated several times.

In the present embodiment, a gas generated from a small quantity of an osmium tetra-oxide crystal in a sublimating cylinder 22 is introduced into the vacuum chamber 10 through a valve 23. A hydrogen gas is also introduced through a valve 12 while a sublimation gas comprising a dilute inert gas is introduced through the valve 13. A pressure is set at, for example, 11 Pa by pressure controllers 20, 21 wherein a pressure is measured by a meter. Thereafter, a voltage is applied to both electrodes 14, 15 from a DC power source 17 and an electric field is generated to thereby generate plasma.

As a plasma generating device in the coating process, any commercially available device can be used. For example, a plasma coating device (NL-OPC80N) manufactured by Nippon Laser Electron Kabushiki Kaisha may be used. In this plasma coating device, a small quantity of osmium tetra-oxide crystal placed in a sublimating cylinder is introduced into a small gas reactor provided with an anode plate and a cathode plate to generate a glow discharge at a selected DC discharge voltage under a dilute sublimation gas pressure. Then, a plasma state is instantly formed between the electrodes to thereby emit light. At this time, ionized osmium atoms instantly deposit on a surface of an aperture 16 placed on the cathode plate to thereby form an amorphous osmium coating. A thickness of the coating is in the order of several nanometers to several tens of nanometers.

In the previous experiment, when only the hydrogen gas was introduced in a chamber, a range of pressure for generating the plasma was extremely narrow, and the plasma was unstable. In order to stabilize the plasma, an argon gas was introduced to the same level as that of the hydrogen gas, and the pressure was adjusted to 11 Pa. The plasma was generated under various conditions by using a mixed gas as described above, and it was found that stable plasma could be produced in a wide pressure range.

Specifically, it was confirmed that stable discharge could be obtained at a pressure from 3 Pa to 20 Pa. It is obvious that if the voltage, current and electrode material are further optimized, the discharge can be carried out under a wider condition. More specifically, the stable discharge is controlled by a distance between the anode and the cathode; electrode material; pressure; voltage; current; and a mixing ratio of the argon gas and the hydrogen gas. It was found that typical conditions were 11 Pa of pressure; 800V of voltage; 5 mA of current; 3 sccm (sccm: gas flow unit) of argon gas; and 3 sccm of hydrogen gas.

Figure 2:
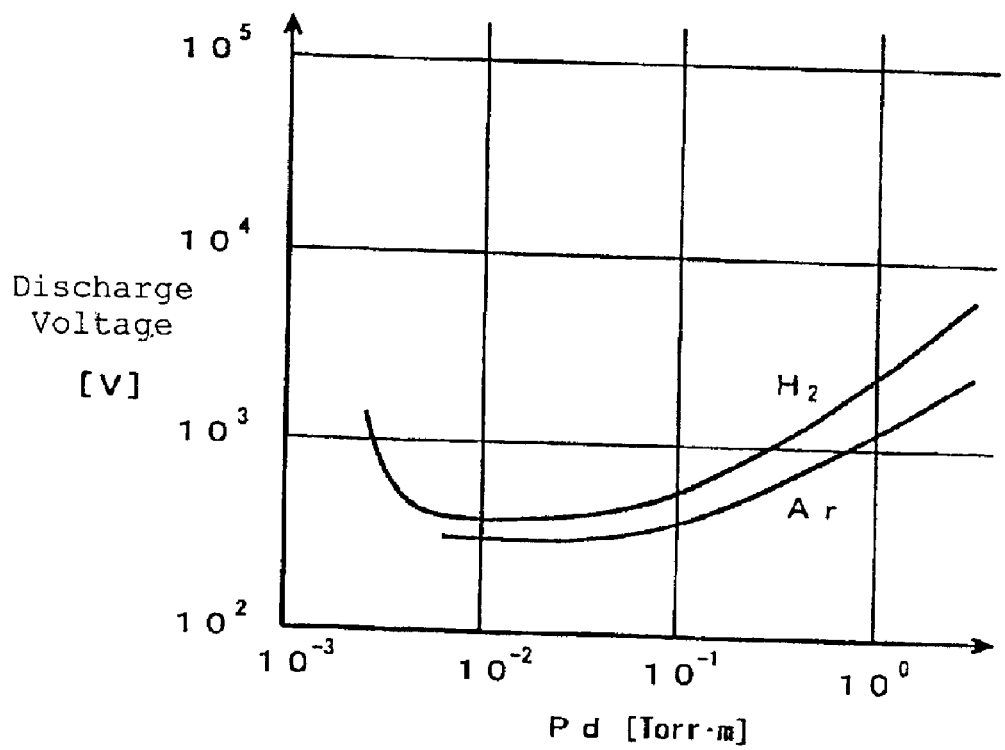
FIG. 2 is a graph showing the Paschen law.

While a condition for the stable discharge is a function of various factors as described above, it generally abides by the Paschen law. FIG. 2 is a graph showing the Paschen law. As shown in FIG. 2, it is known that a minimum voltage V for starting a discharge is present with respect to a product (P·d) of a pressure (P) and a distance (d) between the two electrodes. More specifically, since an electrolytic dissociation does not sufficiently proceed when P·d is extremely small, discharge voltage becomes high. When P·d is too large, since too many collisions prevent the electrons from being accelerated to sufficient energy, the electrolytic dissociation becomes insufficient, so the discharge voltage becomes high.

Therefore, an optimum condition for the stable discharge can be obtained by selecting a pressure and a distance between the two electrodes so that the discharge voltage becomes minimum according to the Paschen law. Also, it is possible to stabilize the hydrogen discharge by adding a rare gas with a low electrolytic dissociation voltage, such as an argon gas and xenon gas.

Figure 3:
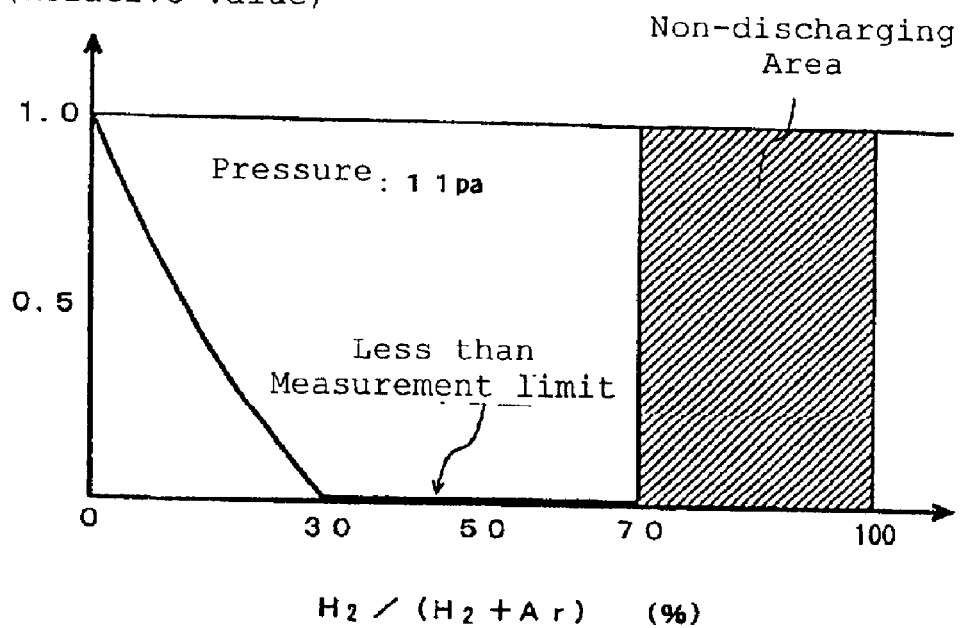
FIG. 3 is a graph showing analysis results of an oxygen impurity content.

An osmium coating layer, coated under the conditions as described above, was analyzed by an Auger electron spectroscopy (AES). In the analysis, three coatings were compared. They were formed from (1) an osmium oxide gas alone; (2) a mixture of an argon gas and an osmium oxide gas; and (3) a mixture of an argon gas, an osmium oxide gas and a hydrogen gas. FIG. 3 is a graph showing results with respect to the oxygen impurity content.

From the results, it was found that the oxygen content was reduced in the order of (1)>(2)>(3). Especially in the case that the hydrogen gas was present, the oxygen content was extremely low, lower than measurement limit, i.e. 0.1%, of AES, in the range between 30% and 70% of the hydrogen content. Incidentally, when the hydrogen content was over 70%, the discharge could not be obtained. Therefore, in the case of the experiment (3) mentioned above, it was found that the range between 30% and 70% of the hydrogen content is preferable.

FIGS. 4(a) and 4(b) show sectional views of the micro-hole area of the aperture plates produced in the experiments (2) and (3) described above, respectively, and suggested chemical reactions. In the case of the experiment (2), osmium oxide radicals (dissociation radical), osmium oxide ions, free osmium atoms and free oxygen atoms were produced through the electron collision of the osmium oxide gas in the plasma. These components react on the surface of the base plate 16 to form an osmium coating 30. If only the free osmium atoms are selectively produced and a coating is formed accordingly, the coating should be consisted of pure osmium. However, oxygen exists as an impurity, since the surface of the osmium metal is oxidized, or the free oxygen atoms contaminate in the coating due to the osmium oxide radicals and the free oxygen atoms produced in the plasma.

On the other hand, as in the above experiment (3), when the hydrogen gas is added, the free hydrogen atoms are generated through collision of electrons in the plasma. The hydrogen radicals have strong reduction activity to thereby lower the oxygen content in a gas phase and, at the same time, reduce the amount of osmium oxide on the surface of the coating. As a result, the osmium coating 30 has high osmium content and a low oxygen content. It is concluded that a high purity osmium layer can be formed by adding the hydrogen gas.

Next, a covering percentage of the coating on an interior of the micro-hole was evaluated by a scanning electron microscope using samples formed under the conditions described above. It was found that the covering percentage increased in the order of (1)<(2)<(3). In other words, it was found that not only the purity but also the covering percentage were improved by adding the hydrogen gas, and a uniform osmium layer was formed on the interior of the micro-hole. The following mechanism is considered to explain these experiment results.

The osmium and osmium oxide radicals generated in the plasma are transferred into the interior of the micro-hole. They start to deposit from an upper portion of the micro-hole according to adhesion coefficients of these coating precursors. Generally, among these radicals, osmium has a higher adhesion coefficient. Thus, osmium starts to accumulate on the upper portion of the micro-hole, and it is difficult to move further into the interior of the coating.

On the other hand, the osmium oxide radical has a relatively low adhesion coefficient, so the osmium oxide radical can be transferred further inside the micro-hole, even if the hole has a high aspect ratio. However, since the osmium oxide precursor essentially contains oxygen, oxygen is mixed in the coating. In the case of the osmium precursor, if oxygen is covering the surface of the coating as the coating formation progresses, although the adhesion coefficient becomes small and the coating can extend to the deep interior of the micro-hole, the purity is lowered due to the oxygen atoms.

However, since the hydrogen atoms generated in the plasma through the addition of the hydrogen gas always terminate non-connected bonds on the surface of the coating or inside thereof, the adhesion coefficient of the precursors becomes extremely low. Therefore, the precursors containing osmium can be easily transferred into the interior of the micro-hole, and, at the same time, oxygen is reduced by hydrogen thus producing a high purity osmium layer. With the mechanism as described above, a uniform and high purity layer can be formed on the interior of the micro-hole.

Further, in the coating formation mechanism above, the hydrogen atoms generated in the plasma are diffused inside the layer, and re-connect on the surface and inside the layer. By the heat generated by this reaction, the metal coating is annealed during its formation. The coating density increases by the anneal effect of the hydrogen radical as mentioned above.

A uniform and dense electrically conductive amorphous osmium with a high purity was obtained over the interior of the micro-hole by: uniform transfer of the precursors including osmium into the interior of the micro-hole; reduction reaction of the hydrogen atoms on the surface; and anneal effect of the hydrogen atoms. It was also found that the coating has a smooth surface in an atomic level observed by an atomic force microscope (AFM).

According to the aperture plate produced by above described method, an excellent focusing characteristic without electron charge was confirmed when the aperture plate was examined by an electron beam device. Further, when a large number of aperture plates were processed, no defect was found in one hundred samples. Therefore, with the method according to the present invention, it was confirmed that aperture plates without electron charge can be consistently produced.

Hereinabove, although the embodiment according to the present invention has been disclosed, in the present invention, the following modifications can be applied. In the above embodiment, although the hydrogen gas and the argon gas are used as additional gases, a xenon or a krypton gas may be used since adding the rare gas is merely to lower a threshold level of the discharge voltage for a stable discharge. As another purpose of the rare gas addition, it is considered that particles accumulated on the opening portion are transferred into the interior of the micro-hole through collision of the rare gas. In any cases, both effects can be obtained by particles consisting of argon, krypton or xenon.

In the present invention, although molybdenum is used as a material of the aperture plate, the present invention is not limited thereto. It was confirmed that the same effect could be obtained when tantalum, tungsten or platinum is used. In the present invention, although the mixing ratio of the argon gas and the hydrogen gas is set at 1:1, the ratio may be changed according to the discharge condition.

In the present embodiment, although the cleaning process and the coating process are disclosed as combined, for example, since only the coating process is needed to improve quality of an aperture plate when compared with the conventional aperture plate, only the coating process may be carried out as a single step. Also, after the coating, a post-treatment, such as annealing, may be carried out.

In the embodiment, although manufacturing a new aperture plate is disclosed, for example, the coating process of the present invention may be applied as a recycling process of a used aperture plate. In such a case, the aperture plate used for a long time after it was provided to an electron microscope needs to be re-coated, since impurities adhere to the aperture plate or the coating is peeled off.

The micro-hole of the aperture plate can be formed by, for example, electrical discharge machining, machining, laser machining or electron beam machining instead of the etching. In these cases, the effects as described above can also be expected by applying the osmium coating thereto.

In the above embodiments, while the case applied to the aperture plate of the electron microscope is disclosed, the present invention is not limited thereto and can be applied to the coating process of any object.

As described above, the present invention has the following effects: electrically conductive amorphous osmium with a uniform density, a smooth surface and high purity layer can be coated over a surface of the aperture plate and the inner surface of the micro-hole formed inside the aperture plate by introducing the osmium oxide sublimation gas, hydrogen gas and argon gas into plasma; and, further, the coating process can be conducted in stable plasma, resulting in high repeatability and low irregularity. Therefore, it is possible to provide the aperture plate with a high resolving power and no electron charge with high repeatability.

While the invention has been explained with reference to the specific embodiment of the invention, the explanation is illustrative and the invention is limited only by the appended claims.

What is claimed is:

1. A method of manufacturing an aperture plate, comprising:
   forming a hole having a predetermined diameter in a metal plate with etching while using resist,
   cleaning the metal plate to remove the resist,
   placing the metal plate in a vacuum chamber of a chemical vapor deposition device,
   charging in the vacuum chamber a mixture of a sublimation gas of an osmium oxide crystal, at least one gas selected from the group consisting of an argon gas, a krypton gas and a xenon gas, and a hydrogen gas, and
   generating plasma inside the vacuum chamber to provide osmium coating on the metal plate.

2. A method according to claim 1, wherein said metal plate is placed on a cathode facing an anode of the chemical vapor deposition device, relations among voltage for discharging plasma, a distance between the cathode and anode and a pressure of the gases in the vacuum chamber being set so that voltage for discharging plasma becomes minimum relative to product of the distance between the cathode and anode and the pressure of the gases in the vacuum chamber.

3. A method according to claim 1, wherein said metal plate is an aperture plate for an electron microscope having the hole therein.

4. A method according to claim 1, wherein in charging the mixture in the vacuum chamber, the sublimation gas of the osmium oxide crystal is generated in a sublimating cylinder and is introduced into the vacuum chamber through a valve.

5. A method according to claim 4, wherein in charging the mixture in the vacuum chamber, said at least one gas and said hydrogen gas are separately introduced into the vacuum chamber through valves.

6. A method according to claim 5, wherein said plasma is generated inside the vacuum chamber at a pressure between 3 to 20 Pa.

7. A method according to claim 6, wherein said gas containing the hydrogen gas is a mixture of the hydrogen gas and the argon gas, and the hydrogen gas is contained in a range between 30 to 70%.

8. A method according to claim 7, wherein said metal plate is formed of molybdenum.

* * * * *